United States Patent
Brown et al.

(10) Patent No.: US 6,963,515 B2
(45) Date of Patent: Nov. 8, 2005

(54) METHOD AND DEVICE FOR A SCALABLE MEMORY BUILDING BLOCK

(75) Inventors: Jeffrey Scott Brown, Fort Collins, CO (US); Craig R. Chafin, Fort Collins, CO (US); Chang Ho Jung, Fort Collins, CO (US)

(73) Assignee: LSI Logic Corporation, Milpitas, CA (US)

( * ) Notice: Subject to any disclaimer, the term of this patent is extended or adjusted under 35 U.S.C. 154(b) by 257 days.

(21) Appl. No.: 10/431,945

(22) Filed: May 8, 2003

(65) Prior Publication Data

US 2004/0223398 A1    Nov. 11, 2004

(51) Int. Cl.[7] ................................................ G11C 8/00
(52) U.S. Cl. ........................ 365/230.03; 365/230.05; 365/230.06
(58) Field of Search ...................... 365/230.03, 230.05, 365/230.06, 189.02, 230.02

(56) References Cited

U.S. PATENT DOCUMENTS

| | | | |
|---|---|---|---|
| 5,953,261 A * | 9/1999 | Furutani et al. | 365/189.05 |
| 5,973,984 A * | 10/1999 | Nagaoka | 365/189.05 |
| 6,181,626 B1 | 1/2001 | Brown | 365/210 |
| 6,434,074 B1 | 8/2002 | Brown | 365/210 |

* cited by examiner

*Primary Examiner*—Richard Elms
*Assistant Examiner*—Hien Nguyen
(74) *Attorney, Agent, or Firm*—Yee & Associates, P.C.

(57) ABSTRACT

The present invention is a method and system for providing a scalable memory building block device. The memory building block device includes a plurality of separate memory arrays, decode logic for selecting only one bit from the plurality of memory arrays, and output means for providing only one bit as an output of the memory building block device, such that the memory building block device generates as its output only one bit.

17 Claims, 4 Drawing Sheets

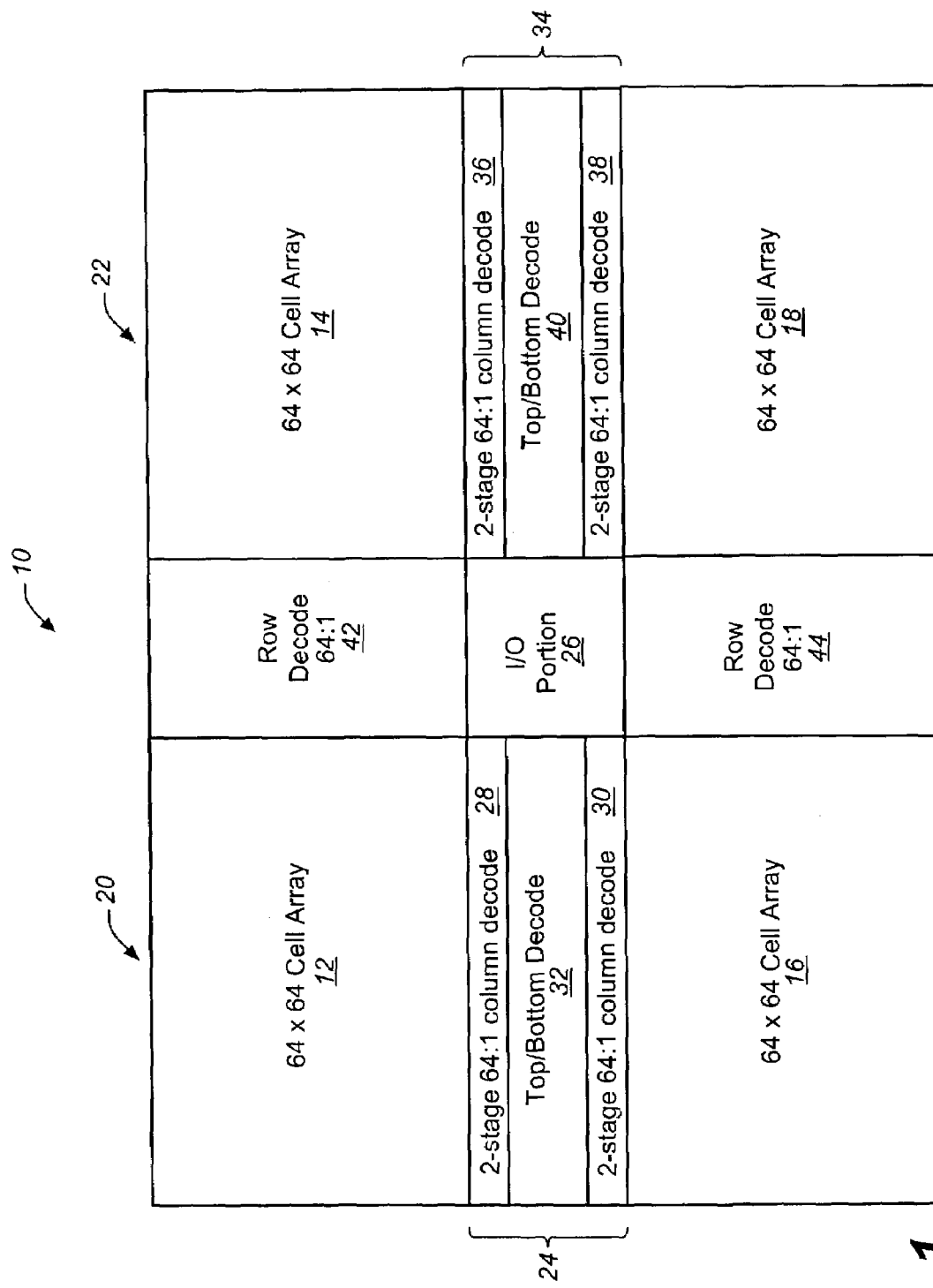
FIG._1

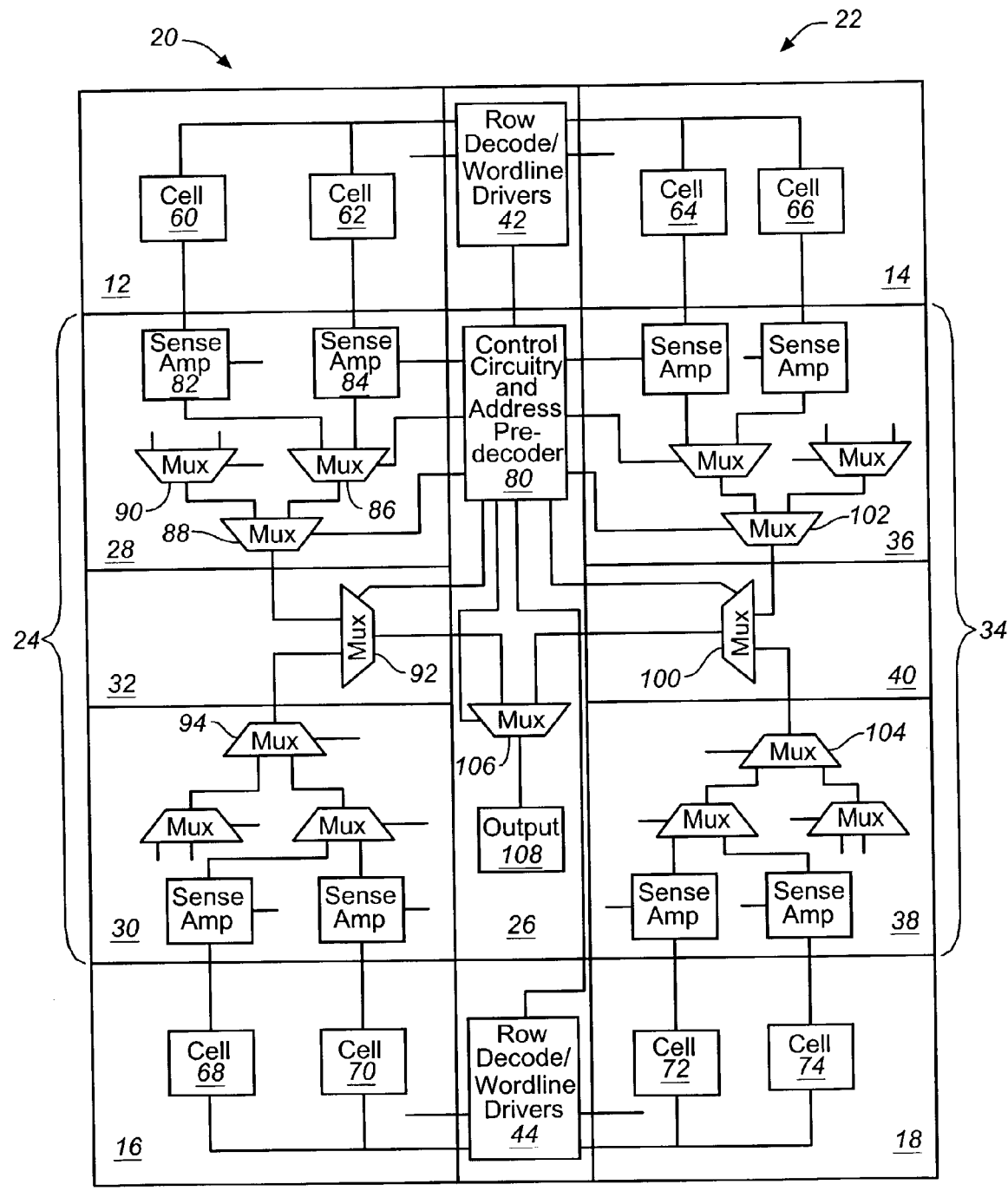
FIG._2

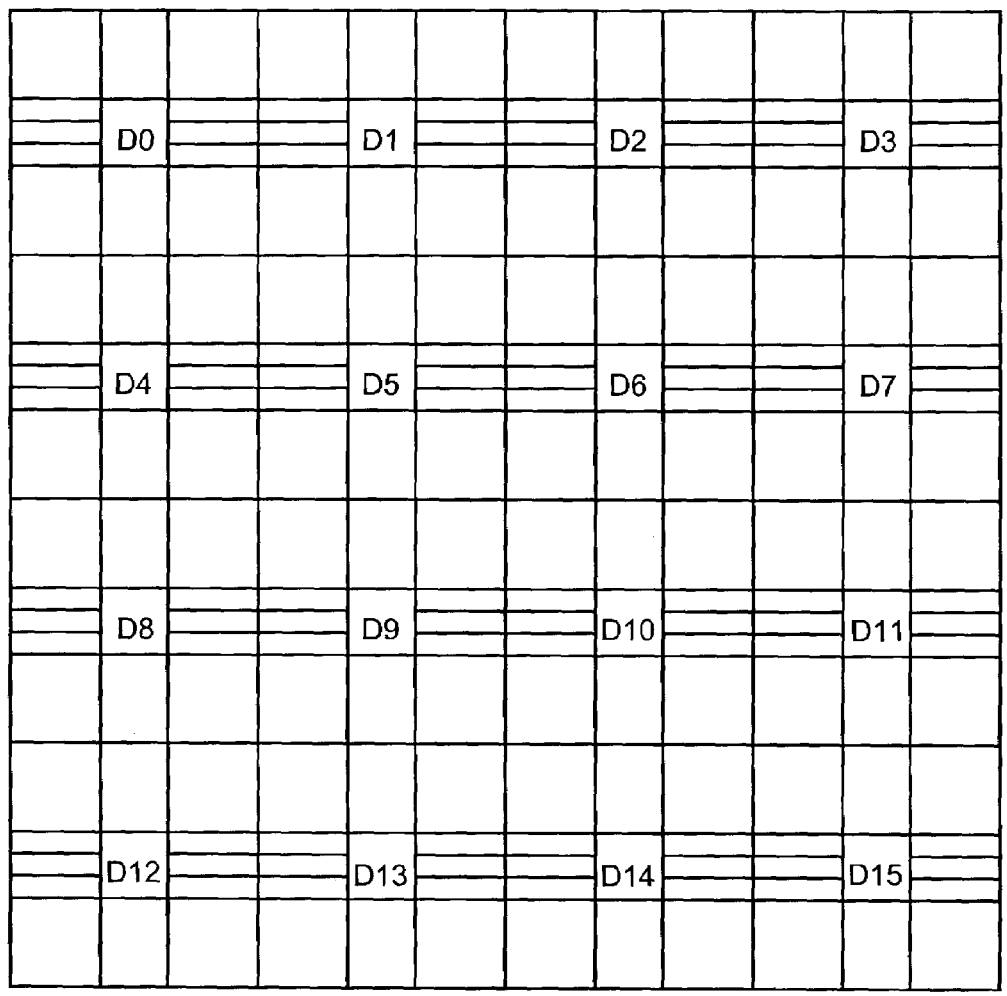
FIG._3

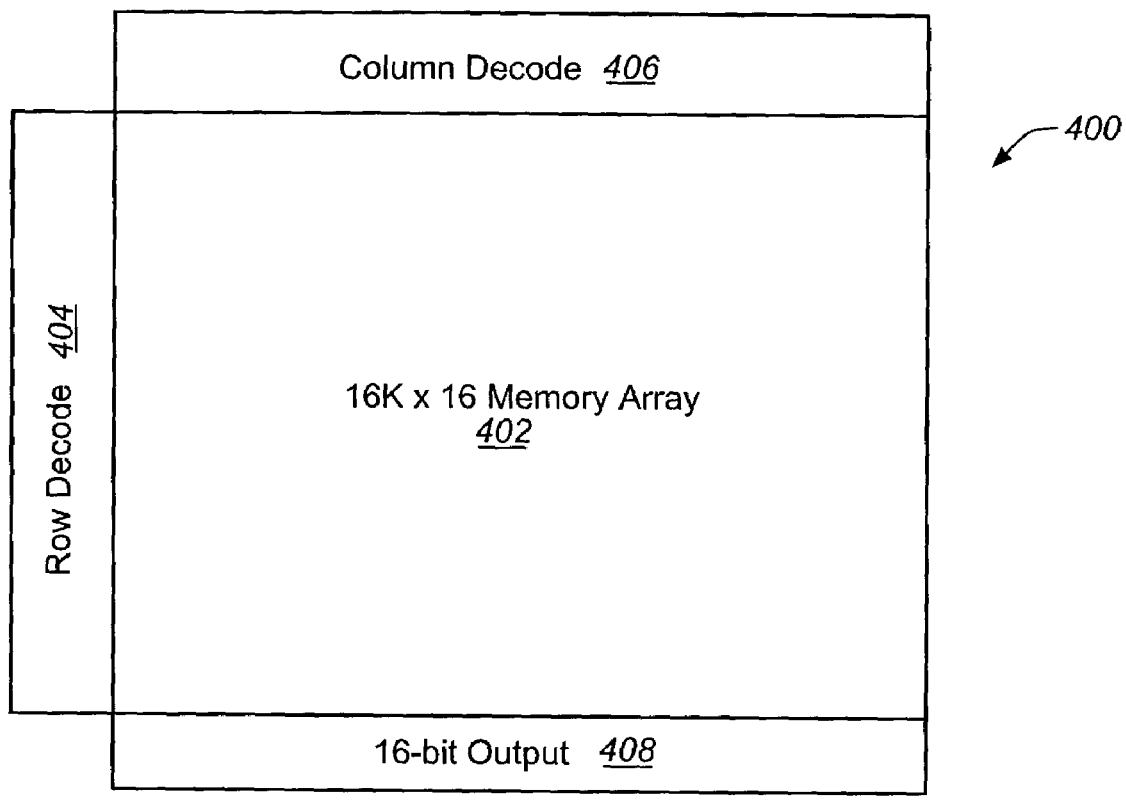
FIG._4
(PRIOR ART)

METHOD AND DEVICE FOR A SCALABLE MEMORY BUILDING BLOCK

BACKGROUND OF THE INVENTION

1. Technical Field

The present invention relates generally to memory circuits, and more particularly to a memory building block that is scalable.

2. Description of the Related Art

Memory devices typically include a memory core having an array of memory cells for storage and retrieval of data. Today's memory devices typically include at least one memory cell array organized in rows and columns of memory cells. The rows of memory cells are coupled through word lines and the columns of memory cells are coupled through bit lines. Each column can have a single bit line, for single-ended memory cells, or a complementary bit line pair, for dual-ended memory cells. Although many architectures are possible, a row or word line decoder including a plurality of word line drivers and a column decoder are provided for decoding an address for accessing a particular location of the memory array. Address decode circuitry is included to select a word line based upon the value of the address provided to the memory device.

Large memory arrays require large drivers and have high internal delays. In addition, compiled memories that reach large configuration ranges can get very slow and use a lot of power due to the increased driver sizes that are required. A compiled memory is any memory which is built in a manner which allows its expansion while keeping the same general functionality. An example of which would be a single port SRAM memory which may be compiled to support numerous memory sizes between a 16×32 and a 16384×128. In order to produce a very large address space, memory arrays get large which result in long access times for the address space.

FIG. 4 depicts a memory 400 having a single 16K×16 memory array in accordance with the prior art. As is shown, memory 400 includes a single large memory array 402. In order to select the desired location within array 402, decoders with a high output drive are required, such as row decode 404 and column decode 406. Row decode 404 and column decode 406 are used to select the appropriate rows and columns to select the desired locations. Based on this address, memory 400 will produce an output 408. In the illustrated example, a 16K×16 bit memory array is used which will produce a 16 bit output. This prior art memory has a slower access time because of the large array of memory cells. Due to the large physical size of the array, the drivers in the decode logic 404 and 406 must be very large, and the bitline movement during a read access will be very slow due to the inherent low drive strength of the memory's bit cells.

Therefore, a need exists for a method and device for a scalable memory building block that will provide improved access times and will provide large address spaces.

SUMMARY OF THE INVENTION

The present invention is a method and system for providing a scalable memory building block device. The memory building block device includes a plurality of separate memory arrays, decode logic for selecting only one bit from the plurality of memory arrays, and output means for providing only one bit as an output of the memory building block device, such that the memory building block device generates as its output only one bit.

The above as well as additional objectives, features, and advantages of the present invention will become apparent in the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

FIG. 1 illustrates a high level block diagram of a memory building block that is a four-quadrant, one-bit memory in accordance with the present invention;

FIG. 2 depicts a more detailed block diagram of the memory building block of FIG. 1 in accordance with the present invention;

FIG. 3 illustrates a high level block diagram of a 16K×16 bit memory built using the memory building block of FIG. 1 in accordance with the present invention; and FIG. 4 depicts a memory having a single 16K×16 memory array in accordance with the prior art.

DETAILED DESCRIPTION

The description of the preferred embodiment of the present invention has been presented for purposes of illustration and description, but is not intended to be exhaustive or limited to the invention in the form disclosed. Many modifications and variations will be apparent to those of ordinary skill in the art. The embodiment was chosen and described in order to best explain the principles of the invention and the practical application to enable others of ordinary skill in the art to understand the invention for various embodiments with various modifications as are suited to the particular use contemplated.

The present invention is a memory building block and a method for using the memory building block for creating a larger memory. FIG. 1 illustrates a high level block diagram of a memory building block that is a four-quadrant, one-bit memory in accordance with the present invention. A memory building block 10 is depicted that includes four memory cores 12, 14, 16, and 18. Each memory core is an array of memory cells. In the depicted example, each memory core includes a 64×64 array of memory cells. Memory building block 10 includes a left portion 20 and a right portion 22. Left portion 20 includes memory core 12 and memory core 16. In addition, left portion 20 includes decode logic 24 used to select one bit from left portion 20 and provide that bit to a central portion 26. Decode logic 24 includes column decode logic section 28, column decode section 30, and a top/bottom decode logic section 32.

Column decode logic section 28 is used to select one of the 64 columns of array 12. Column decode logic section 30 is used to select one of the 64 columns of array 16. Top/bottom decode section 32 is used to select either the output provided by column decode logic section 28 or the output provided by column decode logic section 30. Top/bottom decode section 32 provides the selected output to central portion 26.

Memory building block 10 also includes right portion 22. Right portion 22 includes memory core 14 and memory core 18. In addition, right portion 22 includes decode logic 34 used to select one bit from right portion 22 and provide that bit to central portion 26. Decode logic 34 includes column decode logic section 36, column decode section 38, and a top/bottom decode logic section 40.

Column decode logic section 36 is used to select one of the 64 columns of array 14. Column decode logic section 38 is used to select one of the 64 columns of array 18. Top/bottom decode section 40 is used to select either the output provided by column decode logic section 36 or the output provided by column decode logic section 38. Top/bottom decode section 40 provides the selected output to central portion 26.

Central portion 26 receives address inputs and provides the output for memory block 10. Central portion 26 receives address information and provides address decode and control information to top row decode 42 and to bottom row decode 44. Top row decode 42 is used to select one of the 64 rows of either array 12 or array 14. Bottom row decode 44 is used to select one of the 64 rows of either array 16 or array 18. Central portion 26 also provides control information to devices in decode logic 24 and decode logic 34. Central portion 26 receives the output bit from top/bottom decode 32 and the output bit from top/bottom decode 40. Central portion 26 then selects one of these two bits and provides that one selected bit as the output of memory block 10.

FIG. 2 depicts a more detailed block diagram of the memory building block of FIG. 1 in accordance with the present invention. Memory core 12 provides an array of memory cells, such as cells 60 and 62. In the example depicted, memory core 12 provides a 64×64 array of cells although only two cells are depicted in FIG. 2. Memory core 14 also provides an array of memory cells, such as cells 64 and 66, memory core 16 provides an array of memory cells, such as cells 68 and 70, and memory core 18 provides an array of memory cells, such as cells 72 and 74.

Each array is arranged in rows and columns. Thus, for the depicted example, there are 64 rows and 64 columns of memory cells in each array. Row decode/wordline drivers 42 and 44 are used to select one of the rows of a memory cell. Thus, row decode/wordline drivers 42 selects one of the rows of array 12 or one of the rows of array 14. Similarly, row decode/wordline drivers 44 selects one of the rows of array 16 or one of the rows of array 18. Because memory arrays 12, 14, 16, and 18 are so small, none of the drivers included in row decode/wordline drivers 42 or 44 need to be very large.

Control circuitry and address predecoder 80 is included within central portion 26 and is used to provide control signals to both row decode/wordline drivers 42 and 44 to indicate the row to be selected. In addition, control circuitry and address predecoder 80 provides control signals to sense amplifiers and multiplexers throughout memory building block 10 in order to select the bit that is indicated by the address received by control circuitry and address predecoder 80.

Each memory cell is coupled to a sense amplifier utilizing a pair of bit lines. Each sense amplifier (amp) amplifies the differential voltage placed thereon from accessing a memory cell. The output of each sense amp is provided to two-stage 64:1 decode logic implemented utilizing a plurality of multiplexers. These multiplexers may be implemented using, for example, 8:1 multiplexers.

For example, first column decode logic section 28 includes sense amp 82, sense amp 84, and multiplexers 86, 88, and 90. Cell 60 is coupled to sense amp 82, and cell 62 is coupled to sense amp 84. Multiplexer 86 is coupled to a plurality of sense amps, such as sense amps 82 and 84 and other sense amps that are not shown. Multiplexer 88 receives as its inputs the outputs from multiplexers 86, 90, and other multiplexers that are not shown. All of these multiplexers together make up a two-stage, 64:1 column decode logic. The other column decode logic sections 30, 36, and 38 operate in a similar fashion and include sense amps and multiplexers similar to those described above.

Top/bottom decode 32 includes a multiplexer 92 that receives as its inputs the output from multiplexer 88 and the output from multiplexer 94. Thus, multiplexer 92 is used to select a bit from either array 12 or array 16. In a similar manner, top/bottom decode 40 includes a multiplexer 100 that receives as its inputs the output from multiplexer 102 and the output from multiplexer 104. Multiplexer 100 is used to select a bit from either array 14 or array 18.

I/O portion 26 includes a multiplexer 106 that receives as its inputs the output from multiplexer 92 and the output from multiplexer 100. Thus, multiplexer 106 is used to select a bit from either the left portion 20 of block 10 or the right portion 22 of block 10. Multiplexer 106 then provides its output, depicted as 108, as the output of block 10. As described above, multiplexer 106 provides a single bit output.

FIG. 3 illustrates a high level block diagram of a 16K×16 bit memory built using the memory building block of FIG. 1 in accordance with the present invention. Multiple memory building blocks 10 may be used to build a memory with a wider wordwidth. For example, 16 memory building blocks, such as depicted by FIG. 1, are coupled together to form a memory address space that will produce a 16-bit output. Each of the building blocks function independently to produce a separate bit of the complete 16-bit data output word. They all receive the same address, clock, and enable inputs in parallel. For example, the block responsible for D5 (the 5$^{th}$ bit of the complete data output word) will receive the same address, clock, and enable signals as the block responsible for D0 (the 0$^{th}$ bit of the complete data output word). In this manner, each bit of the complete 16-bit data output word will be generated from a separate instantiation of the memory building block.

Any number of memory building blocks may be used to form a larger memory. In this manner, each memory cell array is small, such as 64×64 in the described example. These small arrays are then used to produce a large memory. The approach of the present invention provides a large memory with a very fast access time.

The present invention is a 1-bit memory building block. In the example depicted, the building block provides a 16K address space. Each of the four quadrants is a memory core that is a 64×64 array of bitcells. There are row decode and wordline drivers located down the middle of the memory block at the top and bottom of the block. As the bitlines feed inward, they pass through a two-stage, 64:1 column decoder provided by 8:1 decoders, and then pass into a 2:1 multiplexer for top or bottom decoding. In the center I/O block of the memory building block, address predecoding is performed in addition to decoding from the right or left portions of the building block. Because the memory cores are small cell arrays, none of the drivers have to be very large. Memory selftime is simple as well. With the small array sizes, required self time compensation for RC effects are minimized. An inverter sense or delay string triggered latching sense amp could be used.

The present invention building block may be used as a standalone memory such that the memory core cells have edge cells, or the blocks may be built for abutment with additional other memory building blocks and tiled in a compiled manner as depicted by FIG. 3. The memory building block of FIG. 1 having quadrants of 64×64 arrays may be used to build a 16K×16 memory, thus producing a 256 Kbit memory. Such a 256 Kbit memory built according to the present invention would have an access time on the order of a typical 512×16 single port center decode memory built according to the prior art.

The present invention provides many advantages over the prior art. Power consumption is minimized due to the quadrant approach and the short bitlines and wordlines that result. The wordline/predecode/write drivers are small. Power consumption is more evenly distributed through each building block and not centralized as it is in prior art memories. Access time is greatly reduced for the memory building block due to the minimal bitline and wordline lengths.

Each building block is fully independent of the others. If the present invention is adopted in a metal programmable chip, for example, any one or more building blocks could easily be left unused so that its metal area could be used for routing. If the building blocks are too large, any quadrant could easily be metal programmed to be disabled.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A memory device comprising:
a plurality of separate memory arrays;
decode logic for selecting only one bit from said plurality of memory arrays; and
output means for providing said only one bit as an output of said memory device, wherein said device generates as its output only one bit.

2. The memory device according to claim 1, further comprising:
each one of said plurality of separate memory arrays being separated from all other memory arrays of said plurality of separate memory arrays by one of a plurality of decode logic sections.

3. The memory device according claim 1, further comprising:
said memory device being a four-quadrant memory device, wherein said plurality of separate memory arrays includes four memory arrays; and
said four-quadrant memory device outputting a single bit output.

4. The memory device according to claim 3, further comprising:
first row decode logic located between first and second quadrants of said four quadrants for selecting a row of said first and second quadrants;
second row decode logic located between third and fourth quadrants of said four quadrants for selecting a row of said third and fourth quadrants;
first column decode logic located between said first and third quadrants for selecting a bit from either said selected row of said first quadrant or said selected row of said third quadrant;
second column decode logic located between said second and fourth quadrants for selecting a bit from either said selected row of said second quadrant or said selected row of said fourth quadrant; and
an I/O portion located between said first row decode logic, second row decode logic, first column decode logic, and second column decode logic for providing said only one bit as said output, wherein said four-quadrant device produces only one bit as an output, further wherein said output bit is either said bit selected by said first column decode logic or said second column decode logic.

5. The memory device according to claim 4, further comprising:
said first column decode logic including an upper decode logic, a lower decode logic, and a logic selector; and
said second column decode logic including a second upper decode logic, a second lower decode logic, and a second logic selector.

6. The memory device according to claim 5, further comprising:
said upper decode logic including a first plurality of multiplexers, and generating a first output;
said lower decode logic including a second plurality of multiplexers, and generating a second output;
said logic selector receiving as its inputs said first output and said second output, and generating a third output;
said second upper decode logic including a third plurality of multiplexers, and generating a fourth output;
said second lower decode logic including a fourth plurality of multiplexers, and generating a fifth output;
said second logic selector receiving as its inputs said fourth output and said fifth output, and generating a sixth output; and
said I/O portion receiving as its input said third output and sixth output, and generating said output.

7. A memory device comprising:
a plurality of separate memory arrays;
decode logic for selecting only one bit from said plurality of memory arrays;
output means for providing said only one bit as an output of said memory device, wherein said device generates as its output only one bit;
said memory device including a first memory array separated from a second memory array by a first decode logic;
said memory device including a third memory array separated from a fourth memory array by a second decode logic;
said first memory array being separated from said third memory array by a third decode logic; and
said second memory array being separated from said fourth memory array by a fourth decode logic.

8. The memory device according to claim 7, further comprising:
   said first decode logic for selecting a first bit from either said first memory array or said second memory array and for providing said selected first bit as an output of said first decode logic; and
   said second decode logic for selecting a second bit from either said third memory array or said fourth memory array and for providing said selected second bit as an output of said second decode logic.

9. The memory device according to claim 8, further comprising:
   an I/O portion for selecting either said first bit or said second bit as a selected bit; and
   said I/O portion for providing said selected bit as an output of said memory device, wherein only one bit is provided as said output.

10. The memory device according to claim 9, further comprising:
    said I/O portion being located between said first, second, third, and fourth decode logic.

11. The memory device according to claim 8, further comprising:
    said first decode logic including a first column decode logic, a second column decode logic, and a logic selector;
    said first column decode logic for selecting a first column decode logic output bit from said first memory array;
    said second column decode logic for selecting a second column decode logic output bit a bit from said second memory array; and
    said logic selector for selecting either said first column decode logic output bit or said second column decode logic output bit and for providing either said first column decode logic output bit or said second column decode logic output bit as said selected first bit as said output of said first decode logic.

12. The memory device according to claim 8, further comprising:
    said second decode logic including a third column decode logic, a fourth column decode logic, and a second logic selector;
    said third column decode logic for selecting a third column decode logic output bit from said third memory array;
    said fourth column decode logic for selecting a fourth column decode logic output bit from said third memory array; and
    said second logic selector for selecting either said third column decode logic output bit or said fourth column decode logic output bit, and for providing either said third column decode logic output bit or said fourth column decode logic output bit as said selected second bit as said output of said second decode logic.

13. A scalable memory having a particular width wordline, said memory comprising:
    a plurality of memory devices, each one of said memory devices including:
      a plurality of separate memory arrays;
      decode logic for selecting only one bit from said plurality of memory arrays; and
      output means for providing said only one bit as an output of said memory device, wherein said device generates as its output only one bit;
    said particular width wordline being a particular number of bits wide;
    each one of said plurality of memory devices providing a different one bit of said particular number of bits;
    said particular width wordline being increased from said particular number of bits wide to a second number of bits wide, wherein additional bits are added to said wordline; and
    a second plurality of memory devices being added to said memory, wherein each one of said second plurality of memory devices provides only one of said additional bits.

14. A method for generating a memory device, said method comprising the steps of:
    said memory device including a plurality of separate memory arrays;
    selecting only one bit from said plurality of memory arrays;
    providing said only one bit as an output of said memory device, wherein said device generates as its output only one bit;
    said memory device being a four-quadrant memory device, wherein said plurality of separate memory arrays includes four memory arrays;
    selecting a row of said first and second quadrants using first row decode logic located between first and second quadrants of said four quadrants;
    selecting a row of said third and fourth quadrants using second row decode logic located between third and fourth quadrants of said four quadrants;
    selecting a bit from either said selected row of said first quadrant or said selected row of said third quadrant using first column decode logic located between said first and third quadrants;
    selecting a bit from either said selected row of said second quadrant or said selected row of said fourth quadrant using second column decode logic located between said second and fourth quadrants; and
    providing said only one bit as said output using an I/O portion located between said first row decode logic, second row decode logic, first column decode logic, and second column decode logic, wherein said four-quadrant device produces only one bit as an output, further wherein said output bit is either said bit selected by said first column decode logic or said second column decode logic.

15. The method according to claim 14, wherein:
    said first column decode logic includes an upper decode logic, a lower decode logic, and a logic selector; and
    said second column decode logic includes a second upper decode logic, a second lower decode logic, and a second logic selector.

16. The method according to claim 15, further comprising the steps of:
    generating a first output using a first plurality of multiplexers included in said upper decode logic;
    generating a second output using a second plurality of multiplexers included in said lower decode logic;
    providing said first output and said second output to said logic selector as its inputs;
    generating a third output using said logic selector;
    generating a fourth output using a third plurality of multiplexers included in said second upper decode logic;
    generating a fifth output using a fourth plurality of multiplexer included in said second lower decode logic;
    providing said fourth output and said fifth output to said second logic selector as its inputs;

generating a sixth output using said second logic selector;
providing said third output and said sixth output to said I/O portion as its inputs; and
generating said output using said I/O portion.

17. A method for scaling a memory having a particular width wordline, said method comprising the steps of:
providing a plurality of memory devices, each one of said memory devices including:
a plurality of separate memory arrays;
decode logic for selecting only one bit from said plurality of memory arrays; and
output means for providing said only one bit as an output of said memory device, wherein said device generates as its output only one bit;
said particular width wordline being a particular number of bits wide;
each one of said plurality of memory devices providing a different one bit of said particular number of bits;
increasing said particular width wordline from said particular number of bits wide to a second number of bits wide, wherein additional bits are added to said wordline;
adding a second plurality of memory devices to said memory, wherein each one of said second plurality of memory devices provides only one of said additional bits.

* * * * *